United States Patent

Martter et al.

[11] Patent Number: 6,137,072
[45] Date of Patent: Oct. 24, 2000

[54] CONTROL PANEL

[75] Inventors: Robert H. Martter; Craig C. Sundberg; Richard N. Giardina; William P. Laneve; G. James Deutschlander, all of Erie, Pa.

[73] Assignee: Ferro Corporation, Cleveland, Ohio

[21] Appl. No.: 09/320,083

[22] Filed: May 26, 1999

[51] Int. Cl.[7] .................................................. H01H 13/70
[52] U.S. Cl. ........................................... 200/512; 200/5 A
[58] Field of Search .................................... 200/5 A, 512, 200/514, 341, 511, 406, 517, 343; 341/22, 34, 176; 400/472, 490, 491, 491.2

[56] References Cited

U.S. PATENT DOCUMENTS

| | | | |
|---|---|---|---|
| 3,676,943 | 7/1972 | Kidd, Jr. et al. | 40/130 M |
| 4,065,649 | 12/1977 | Carter et al. | 200/5 A |
| 4,228,330 | 10/1980 | Larson | 200/5 A |
| 4,249,054 | 2/1981 | Komaki | 200/159 B |
| 4,303,811 | 12/1981 | Parkinson | 200/5 A |
| 4,317,013 | 2/1982 | Larson | 200/5 A |
| 4,365,168 | 12/1982 | Chaput et al. | 307/115 |
| 4,394,547 | 7/1983 | Larson | 200/5 A |
| 4,551,586 | 11/1985 | Latasiewicz | 200/5 A |
| 4,580,018 | 4/1986 | Yoshihara | 200/5 A |
| 4,620,075 | 10/1986 | La Belle et al. | 200/159 B |
| 4,639,559 | 1/1987 | Taguchi | 200/5 A |
| 4,771,139 | 9/1988 | DeSmet | 200/5 A |
| 4,818,827 | 4/1989 | Ipcinski et al. | 200/5 A |
| 4,894,493 | 1/1990 | Smith et al. | 200/5 A |
| 4,901,074 | 2/1990 | Sinn et al. | 341/22 |
| 4,975,676 | 12/1990 | Greenhalgh | 338/114 |
| 5,574,623 | 11/1996 | Girard | 361/627 |
| 5,721,666 | 2/1998 | Girard | 361/627 |
| 5,747,757 | 5/1998 | Van Zeeland et al. | 200/5 A |

*Primary Examiner*—Michael Friedhofer
*Attorney, Agent, or Firm*—Rankin, Hill, Porter & Clark LLP

[57] ABSTRACT

A touch control panel for use in controlling an electrical device such as a washer, dryer, stove, microwave or related piece of electrical equipment. In a preferred embodiment, the touch control panel comprises an outer panel formed of flexible aluminum. The outer panel includes an outer and an inner surface. The inner surface of the aluminum panel includes a first circuit formed along at least a portion of the surface. The control panel also includes an inner support panel comprising a porcelain enamel metal substrate. The porcelain enamel metal substrate affords a highly durable and rigid degree of support to the control panel. The support panel has an inner surface which is spaced from and disposed substantially parallel to the inner surface of the outer panel. The inner surface of the metal substrate has formed along at least a portion thereof a second circuit. Upon application of tactile pressure upon the outer surface of the outer panel, the first circuit contacts the second circuit. Upon release of the tactile pressure, the first circuit disengages contact with the circuit.

10 Claims, 2 Drawing Sheets

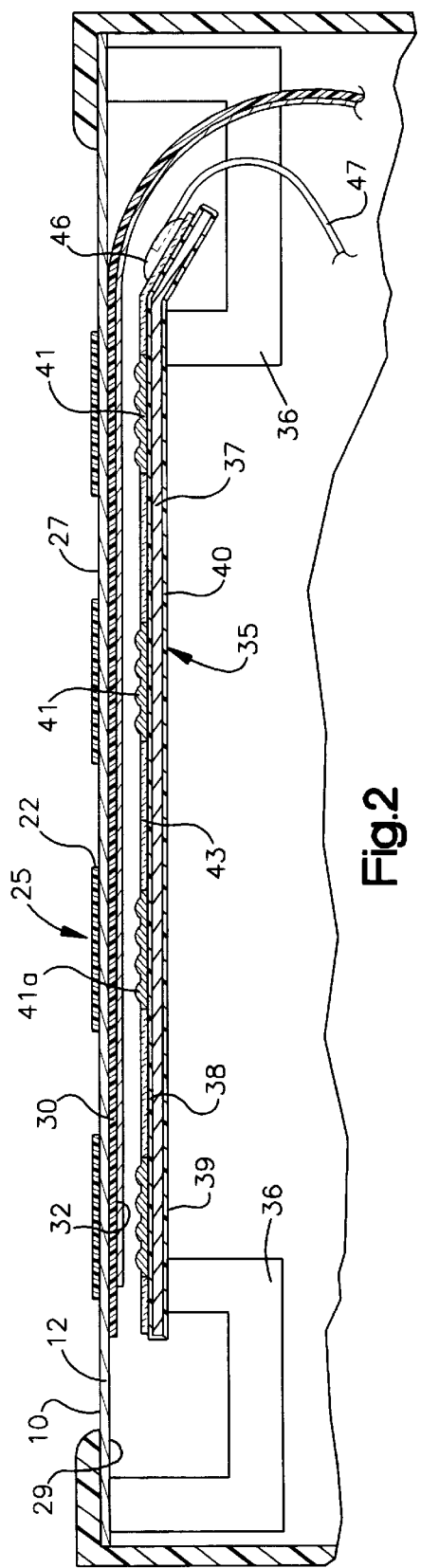
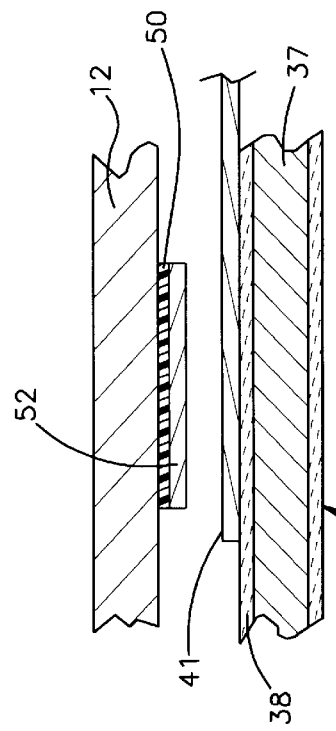
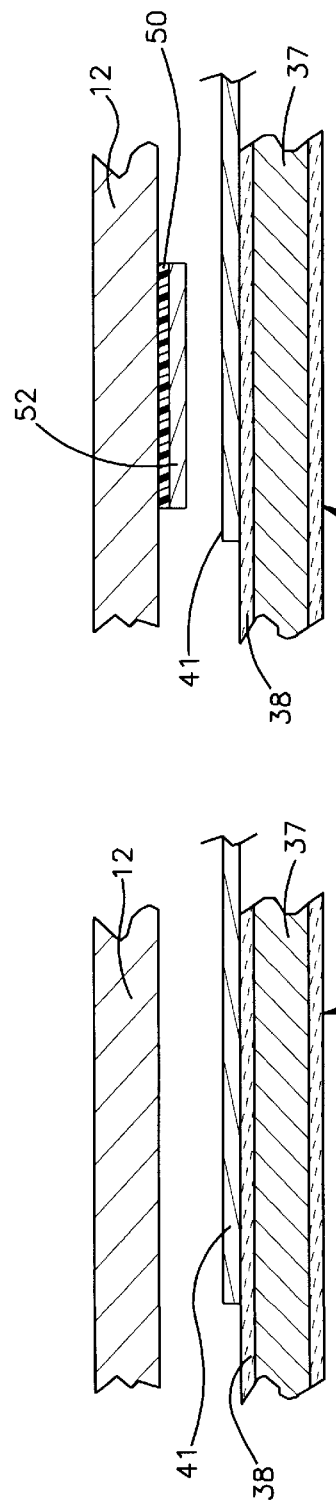

CONTROL PANEL

TECHNICAL FIELD

The present invention concerns a highly durable control panel for use in controlling electrical devices such as washers, dryers, stoves, microwaves, electrical equipment and related devices. More particularly, the present invention concerns a metal faced control panel having touch sensitive switches.

BACKGROUND

Historically, decorated metal control panel information plates have been used in conjunction with mechanical switches, timers and actuators to allow the consumer to control a machine such as a washer, dryer, range or stove. These mechanical devices have stems that protrude through holes of vaious sizes in the graphics portion of the control panel which is decorated by a stylized presentation of information describing available functions to the consumer. The stems are capped by knobs and buttons that tend to cover or extend beyond the holes and finish the control panel. All this complexity makes it difficult for the consumer to clean the control panel while mechanical switches are expensive and losing desirability because of cost and a growing perception that they are "old" or "outdated" technology.

More recently, touch sensitive switches have been used extensively to replace mechanical switching devices. Examples of such touch sensitive switches may be found in U.S. Pat. Nos. 4,975,676; 4,065,649; 4,228,330; 4,394,547; 4,639,559; 4,818,827; 4,901,074 and 5,747,757. One type of touch sensitive switch that is commonly employed in connection with control panels is membrane switches. U.S. Pat. No. 5,747,757 specifically concerns a control panel comprising a membrane switch. Membrane switches generally comprise a combination of a decorated information plate and functional circuitry. The movement towards membrane switches was driven by lower cost and a consumer base who appreciates ease of cleaning. These membrane switches are typically flat, thin and flexible. They are added to the top surface of the control panel support by an adhesive. Inherently, they have a ribbon connector which is fed through a hole in the support for connection to other control circuitry.

Membrane switches in many applications such as shown in U.S. Pat. No. 5,747,757 are laminated or adhered to the surface of a steel or aluminum supporting plate to form the control panel. During manufacturing there is a problem of aligning the sticky back of the membrane circuit to the supporting face intended to hold it. Placement of the membrane switch in many applications is critical to the aesthetic and function, especially where a see-through window is required for a clock, lights or other device requiring alignment. Once the membrane has been placed, the adhesive makes it impossible to remove and reposition so the combination of membrane and support base has to be discarded or used with the defect if alignment is not proper.

Membrane switches in many applications require the use of a polycarbonate decorated face. The polycarbonate face provides better wear resistance because the polyester of the membrane is easily scratched and polycarbonate is a better window material because of its superior transparency and resistance to scratching. However, this specialization increases the cost of the membrane switch circuit and graphics combination.

Once the decorated membrane switch circuits are laminated to a supporting surface, the edges sometimes do not stick or they turn up over time creating a poor aesthetic look. Even a properly placed laminate that is brand new can appear wavy and uneven looking. Poor attachment at the edges causes the consumer to feel that the device is falling apart or old. This edge is also exposed to cleaning operations and chemicals during cleaning which exacerbates the problem. The control panel of the present invention is not susceptible to such a problem.

The control panel of the present invention allows one to create switching circuitry using the support substrates by themselves, without the addition of a separate switching device such as a separate membrane switch assembly. The supports and the switch circuitry are integral. One supporting surface is thus also the decorated panel itself. This approach eliminates the need for a stick-on membrane switch or assembly and thus it provides a less expensive and more robust control panel. It further improves the ease of cleaning experienced by the consumer because there are no edges that can furl and no plastic to scratch. The control panel of the present invention is flat and continuous and it is also design versatile. Where desired, it can accommodate and support knobs or buttons, or large devices such as mechanical timers. Materials used to decorate the surface are robust and lend themselves to screen printing and sublimation transfer imaging. Moreover, the control panel employs an inner support panel upon which circuitry is formed that is highly durable. This inner support panel comprises superdurable porcelain enameled metal.

SUMMARY OF INVENTION

The present invention provides a new and improved control panel for use in controlling an electrical device such as a washer, dryer, stove, microwave or related piece of electrical equipment. The control panel of the present invention is highly durable for it is amenable to easy cleaning and it is very resistant to scratching. Additionally, the control panel can withstand relatively high temperatures and since the outer and inner panels comprise metal, they are not susceptible to breaking or cracking. Also, the switch circuit that may be formed may be made highly conductive and it can be made to offer far less contact resistance as compared to conventional membrane switches. Furthermore, the support panel of the control panel affords exceptional support, thereby facilitating the mounting of circuit devices thereon including the through surface mounting of such devices.

In one preferred embodiment the control panel comprises an outer panel formed of flexible aluminum. The outer panel includes an outer and an inner surface. The inner surface of the aluminum panel includes a first circuit formed along at least a portion of the surface. The control panel also includes an inner support panel comprising a porcelain enamel metal substrate. The support panel has an inner surface which is spaced from and disposed substantially parallel to the inner surface of the outer panel. The inner surface of the metal substrate has formed along and directly on at least a portion thereof a second circuit. Upon application of tactile pressure upon the outer surface of the outer panel, the first circuit contacts the second circuit. Upon release of the tactile pressure, the first circuit disengages contact with the second circuit.

The foregoing and other features of the invention are hereinafter more fully described and particularly pointed out in the claims, the following detailed description and the annexed drawings setting forth in detail certain illustrative embodiments of the invention, these being indicative, however, of but a few of the various ways in which the principles of the present invention may be employed.

BRIEF DESCRIPTION OF DRAWINGS

In the annexed drawings:

FIG. 2 is a broken-away, partially schematic cross-sectional view of the control panel of FIG. 1 taken through line 2—2 thereof, FIG. 3A is a cross-sectional view that illustrates schematically an alternative embodiment of a control panel made in accordance with the present invention; and FIG. 3B is a cross-sectional view that illustrates schematically yet another embodiment of a control panel made in accordance with the present invention.

DETAILED DESCRIPTION OF PREFERRED EMBODIMENTS

Figure 1:
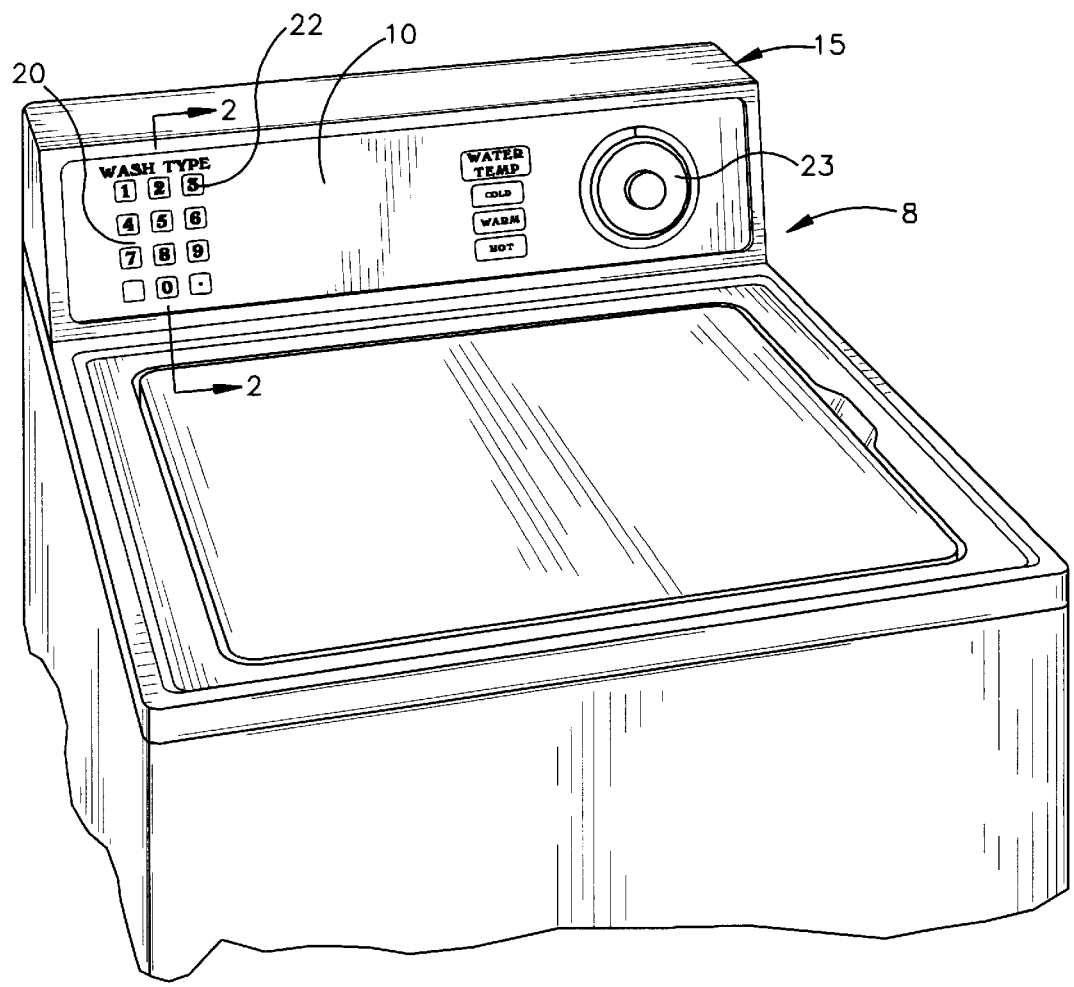
FIG. 1 is a perspective view of an appliance having a control panel made in accordance with the present invention.

Referring now to FIG. 1 there is illustrated an appliance 8, such as a washer, having a control panel 10 made in accordance with the present invention. Referring now additionally to FIG. 2, control panel 10 comprises an outer panel 12 formed of a continuous flexible sheet of aluminum. Outer panel 12 must be capable of yielding upon application of tactile pressure and providing the required electrical contact as further discussed below. One suitable grade of aluminum sheet suitable for use in the present invention is aluminum sheet, grade AA1100, with a thickness of about 0.30" available from Alumax of Lancaster, Pa. Of course, it will be appreciated that other grades of aluminum will also be suitable for use in the present invention.

Control panel 10 is mounted within the control section or box 15 of the appliance 8. Control panel 10, which for purposes of illustrative example only represents a simplified form of a control panel. Area 20 of the control panel 10 may be used to control the various electrical functions of the appliance 8. The individual switches 22 of the area 20 are activated by applying tactile pressure thereto.

As illustrated in FIG. 2, control panel 10 includes a decorative coating 25 formed thereon, such as, for example, by screen or graphic printing. It will be appreciated that any one of a variety of decorating techniques known to those skilled in the art may be employed to decorate the outer surface 27 of the outer panel 12 and provides the desired graphics, indicia or other labeling. Disposed along the inner surface 29 of outer panel 12 is a layer of flexible polymeric film 30 having a circuit 32 formed thereon. Polymeric film 30 must exhibit dielectric/insulative properties. Film 30 may be either purchased as a sheet material or deposited/printed from a liquid such as by the use of a polymer thick film material. An example of a film suitable for use with the present invention is a print treated clear polyester film available from Tekra Corporation under the trade designation Melonex 505. Another suitable film is a film available from Flexcon under the trade designation Flexmark PM700-C. Such films may be bonded to the aluminum using a conventional adhesive. Circuit 32 is preferably formed by application of a conductive polymer thick film material. An example of such a material is silver conductor polymer thick film available from DuPont under the trade designation 5025. Of course, various other types of polymeric conductors may be employed. Conventional application techniques such as screen printing may be used to form circuit 32.

Control panel 10 also includes a rigid inner panel 35. Inner panel 35 comprises a metal base or substrate 37 coated along its inner surface 38 and outer surface 39 with porcelain enamel 40. Substrate 37 may comprise any one of a variety of metal materials. In one preferred embodiment substrate 37 comprises a section of low carbon steel coated along all sides with the porcelain enamel 40. Porcelain enamel substrates are available from the ECA Electronics Company of Erie, Pa. In addition to a porcelain enameled steel substrate, it will be appreciated that substrate 37 may be formed from any number of other conventional metal strips or sections that afford excellent durability such as stainless steel, aluminum, brass or copper. These metals may be coated with porcelain enamel or in the case of aluminum, the aluminum may be anodized, the anodized layer forming a dielectric coating on the aluminum.

Substrate 37 provides a durable and rigid support that may be utilized to support or mount conventional electronic devices such as, for example, mechanical switches, LED's and mechanical timers (23) as shown in FIG. 1. Substrate 37 permits either surface mounting of devices or through surface mounting of devices. Substrate 37 does not lose its structural integrity when it is provided with apertures to facilitate through surface mounting.

Referring further to FIG. 2, there is included a ribbon connecter along the top surface of the porcelain enamel 40 and an electrical circuit 41 formed using a cermet thick film. Disposed between the areas of circuit 41 is an encapsulant layer 43. It will be appreciated that the encapsulant layer may be applied to various thicknesses, for example, it may be made coplanar with the top of raised portions 41a of circuit 41. Electrically attached or connected to the circuit 41 by a solder joint 46 is a wire lead ribbon cable 47. Cable 47 is utilized to communicate circuit signals to electronic or electrical devices or circuits contained in the appliance. It will be appreciated that circuit element 32 may also be provided with a ribbon cable to carry such signals.

Circuit 41 is formed in a conventional manner using a suitable commercially available cermet thick film or ink. Such thick film is printed on the enamel or other dielectric coating using conventional techniques, such as, for example screen printing. Examples of other possible techniques include spraying, dipping, transfer printing, spinning, brushing and application using a doctor blade. The conductive path or circuit 41 may be formed, for example, using a cermet thick film conductor sold under the trade designation 9996-B by Electro Science Labs of King of Prussia, Pa. Another suitable source of material is a thick film sold by Ferro Corporation of Cleveland, Ohio, under the trade designation FX-33-107. A suitable encapsulant layer 43 may be formed using a glass encapsulant glass system sold by the Ferro Corporation of Cleveland, Ohio, under the trade designation A-3565. The glass encapsulant serves to prevent corrosion between adjacent/parallel circuit traces and particulate migration between such traces. After application of the cermet and encapsulant materials, such materials are dried and then fired at a temperature in excess of about 575°C., and preferably around 625° C.

Inner panel 35 and outer panel 12 are separately held in position and alignment within control section 15 by metal clips 36. There is no need to first mount or attach together inner panel 35 and outer panel 12, although it may be done if so desired. It will be appreciated that any number of conventional fastening and/or mounting techniques may be employed for mounting the panels including the use of adhesives and mechanical fasteners such as screws and bolts. Contact between circuit 41 and circuit 32 is effectuated by applying light tactile pressure upon graphics 25. Upon application of pressure, outer panel 12 flexes allowing contact between circuits 41 and 32. Inner panel 35 and outer panel 12 are spaced a distance of from about 0.010 inches to about 0.100 inches. In most applications suitable spacing of the panels is from about 0.020 inches to about 0.050 inches in order to achieve the desired tactile feel. A polymeric gasket or sealing material may be provided along the edge of the panels to help keep moisture out of the region between the panels. An example of a suitable material for use in forming the gasket is SYLGARD 529 available from Dow-Corning Corporation.

Referring now to FIG. 3A there is illustrated yet another embodiment made in accordance with the present invention. In each of the succeeding figures, like reference numerals are used to identify similar elements as shown in FIGS. 1 and 2. In the embodiment shown in FIG. 3A no separate circuit traces are formed on outer panel 12. Instead, panel 12 itself serves as an electrical conductor or circuit relative to circuit 41 formed on the porcelain enamel 38. Referring now to FIG. 3B, a layer of polymer thick film insulation material 50 is first applied, upon which a layer of polymer thick film conductor 52 is applied to form a conductive circuit.

Although the invention has been shown and described with respect to preferred embodiments, it is obvious that equivalent alterations and modifications will occur to others skilled in the art upon reading and understanding the specification. The present invention includes all such equivalent alterations and modifications, and is limited only by the scope of the following claims.

What is claimed:

1. An electrical touch control panel comprising:

an outer panel of flexible aluminum having an inner and outer surface and a first circuit;

an inner support panel comprising a porcelain enamel coated metal substrate, said support panel having an inner surface which is spaced from and disposed substantially parallel to the inner surface of said outer panel, said inner surface of said metal substrate having formed along at least a portion thereof a second circuit such that upon application of tactile pressure upon the outer surface of said outer panel, said first circuit contacts said second circuit and upon release of the tactile pressure, said first circuit disengages contact with said second circuit;

a glass encapsulant layer formed along the inner surface of said inner support panel.

2. A control panel as set forth in claim 1 wherein said metal substrate comprises low carbon steel.

3. A control panel as set forth in claim 1 wherein said inner support panel and said outer panel are spaced a distance of from about 0.010 inches to about 0.100 inches.

4. A control panel as set forth in claim 1 wherein said outer panel includes no circuit traces and thus by itself comprises said first circuit.

5. A control panel as set forth in claim 1 wherein said first circuit of said outer support panel includes a circuit trace formed along at least a portion of said inner surface of said outer support panel.

6. A control panel as set forth in claim 1 wherein said second circuit comprises a cermet thick film.

7. A control panel as set forth in claim 1 wherein said inner panel and said outer support panel are spaced a distance of from about 0.020 inches to about 0.050 inches.

8. A control panel as set forth in claim 1 wherein said first circuit comprises a layer of insulative polymeric film having formed thereon a conductive polymer thick film.

9. A control panel as set forth in claim 1 wherein said first circuit comprises a layer of conductive polymer thick film.

10. A control panel as set forth in claim 1 wherein the outer surface of said outer panel is decorated.

* * * * *